(12) United States Patent
Vasenkov

(10) Patent No.: US 7,794,797 B2
(45) Date of Patent: Sep. 14, 2010

(54) SYNTHESIS OF CARBON NANOTUBES BY SELECTIVELY HEATING CATALYST

(75) Inventor: Aleksey V. Vasenkov, Huntsville, AL (US)

(73) Assignee: CFD Research Corporation, Huntsville, AL (US)

( * ) Notice: Subject to any disclaimer, the term of this patent is extended or adjusted under 35 U.S.C. 154(b) by 331 days.

(21) Appl. No.: 11/668,741

(22) Filed: Jan. 30, 2007

(65) Prior Publication Data

US 2008/0182027 A1 Jul. 31, 2008

(51) Int. Cl.
*C23C 16/00* (2006.01)
*C23C 4/00* (2006.01)
(52) U.S. Cl. .................... 427/450; 427/249.1; 977/742
(58) Field of Classification Search ................. None
See application file for complete search history.

(56) References Cited

U.S. PATENT DOCUMENTS

| 6,350,488 | B1 * | 2/2002 | Lee et al. ................. 427/249.1 |
| 6,953,562 | B2 * | 10/2005 | Baker et al. .............. 423/447.3 |
| 2002/0090468 | A1 * | 7/2002 | Goto et al. ................... 427/580 |
| 2006/0068126 | A1 * | 3/2006 | Ting et al. ................... 427/569 |
| 2008/0159944 | A1 * | 7/2008 | Park ........................ 423/447.3 |

* cited by examiner

*Primary Examiner*—Timothy H Meeks
*Assistant Examiner*—Joseph Miller, Jr.
(74) *Attorney, Agent, or Firm*—Tomas Friend

(57) ABSTRACT

The present invention is a catalytic chemical vapor deposition method and apparatus for synthesizing carbon nanotubes and/or carbon nanofibers (CNTs) on a substrate by selectively heating a catalyst for CNT synthesis on or near the surface of the substrate. Selective heating of the catalyst is achieved using an exothermic oxidation reaction on the surface of the catalyst. Selective heating of the catalyst prevents heating of the substrate and enables the synthesis of CNTs on temperature sensitive substrates.

5 Claims, 4 Drawing Sheets

A

B

SYNTHESIS OF CARBON NANOTUBES BY SELECTIVELY HEATING CATALYST

STATEMENT REGARDING FEDERALLY SPONSORED RESEARCH OR DEVELOPMENT

The U.S. Government may have certain rights in this invention pursuant to SBIR Contract OII-0611099 awarded by the National Science Foundation.

CROSS-REFERENCE TO RELATED APPLICATIONS

Not Applicable

INCORPORATED-BY-REFERENCE OF MATERIAL SUBMITTED ON A COMPACT DISC

Not Applicable

BACKGROUND OF THE INVENTION

1. Field of the Invention

The present invention pertains to the synthesis of carbon nanotubes by catalytic chemical vapor deposition methods. Specifically, the present invention involves methods and apparatus, for making carbon nanotubes comprising the selective heating of catalysts and their products.

2. Description of Related Art

Carbon nanotubes (CNTs) are graphitic filaments/whiskers with diameters ranging from 0.4 to 500 nm and lengths in the range of several micrometers to millimeters. The designation "CNT" is often used to call all types of vertically aligned carbon tabular structures including single-wall CNTs, multi-wall CNTs, and carbon nanofibers. CNTs exhibit a variety of desirable and unique electronic and mechanical properties. For example, the thermal conductivity of CNTs is about twice that of diamond, and the electric-current-carrying capacity of CNTs is $10^3$ higher than that of copper wires. In addition, the elastic modulus of CNTs is about double that of diamond and their strength is 10-100 times higher than that of the strongest steel. These useful properties of CNTs, coupled with their unusual molecular symmetry, have opened new frontiers in the manufacturing of electron field emission sources, nanodiodes, nanotransisters, biological probes, scanning probe microscopy tips, composite polymers, and hydrogen and energy storages (1).

Catalytic Chemical Vapor Deposition (CCVD) and Plasma Enhanced Catalytic Chemical Vapor Deposition (PECCVD) syntheses of CNTs are often used to synthesize CNTs directly on substrates. Both methods involve temperatures high enough (above 500° C.) to provide the energies needed for the chemical reactions that produce CNTs. In a PECCVD method, this heat is provided by plasma. Plasma-assisted growth of CNTs is typically conducted in a DC plasma reactor (2). Such a reactor comprises a grounded anode and a powered cathode. The wafer substrate used for the synthesis of CNTs is placed either on the anode or cathode. The electrode holding the wafer typically has a heating source which is used to increase the wafer temperature and consequently enable CNT formation. A disadvantage of DC systems is the formation of high negative bias on the wafer in these systems (>300 V). Recently, microwave reactors have come into use for the synthesis of CNTs. Plasma in such a reactor is sustained by the microwave source, and an additional DC or RF power supply may independently control the energy of ions striking the wafer.

High crystalline quality material can typically be produced only at very high temperatures, such as 500° C. or higher. This heating often damages the substrate or causes device integration problems (3-5). WO 03/011755 A1, incorporated herein by reference in its entirety, discloses a method for making CNTs on a substrate wherein the temperature of the substrate is maintained at a temperatures ranging from 30° C. to 300° C. This method uses a radio frequency (RF) source to generate plasma that enhances chemical vapor deposition by providing the energy required for the reactions that produce CNTs. One advantage disclosed for this method is the replacement of a filament used to generate plasma by a RF source. The amount of heat transferred to substrate by RF-generated plasma is less than that transferred from a filament, making it possible to maintain lower substrate temperatures during CNT synthesis.

The method of the present invention provides selective heating of only catalyst particles, thereby applying high temperature only to the catalyst surfaces where CNT-forming reactions occur and preventing excessive heating of the substrate. This is achieved by using one or both of two mechanisms of heating: (i) heating from exothermic reactions of catalytic oxidation on the surface of catalyst and (ii) heating from an RF source tuned to efficiently heat catalyst. This allows catalytically grown nanostructures on temperature-sensitive materials without damaging substrate structure. In contrast to WO 03/011755 A1, the present method does not require plasma or an RF source to generate plasma and uses a RF source tuned to a frequency that heats catalyst specifically and is dependent on the size of catalyst particles.

BRIEF SUMMARY OF THE INVENTION

In one embodiment, the present invention is a method for synthesizing CNTs on a substrate comprising the selective heating of a catalyst using an exothermic reaction.

In a second embodiment, the present invention is an article of manufacture comprising CNTs synthesized on a substrate using a method comprising the selective heating of a catalyst by an exothermic reaction of catalytic oxidation.

In a third embodiment, the present invention is a method for synthesizing CNTs on a substrate comprising the selective heating of a catalyst by a RF source.

In a fourth embodiment, the present invention is an article of manufacture comprising CNTs synthesized on a substrate using a method comprising the selective heating of a catalyst by a RF source.

In a fifth embodiment, the present invention is method for synthesizing CNTs comprising the selective heating of a catalyst using an exothermic reaction of catalytic oxidation and a RF source.

In a sixth embodiment, the present invention is an article of manufacture comprising CNTs synthesized on a substrate using a method comprising the selective heating of a catalyst using an exothermic reaction of catalytic oxidation and a RF source.

In a seventh embodiment, the invention is an apparatus for the synthesis of CNTs comprising an RF source positioned and tuned to specifically and efficiently heat catalyst.

BRIEF DESCRIPTION OF THE SEVERAL VIEWS OF THE DRAWINGS (IN PROGRESS)

DETAILED DESCRIPTION OF THE INVENTION

Definitions

The term "carbon nanotubes" (CNTs) is used herein in a generic sense to include single-walled and multi-walled carbon nanotubes, carbon nanofibers, carbon nanofilaments, and carbon nanoropes.

A radio frequency (RF) source is used herein to describe a device that generates electromagnetic fields having frequencies of between 1 GHz and 100 GHz.

The term "catalyst" is used with the art accepted meaning and, in the case of catalytic CNT synthesis includes metals such as Ni, Fe, Co, Cu, Al, V, Y, Mo, Pt, Pd and their binary and ternary alloys. A catalyst may be sputter deposited in thin films on substrates and exist as nanoparticles with a size typically ranging from 1 nm to 1 μm.

A 'temperature-sensitive" substrate in the context of the present disclosure is a substrate that can be damaged or rendered incapable of integration into a larger system by exposure to elevated temperatures and includes graphite, glass, plastics, silicon, textiles, papers, and organic polymers.

Selective Catalyst Heating Using Exothermic Reactions

In many PECVD processes both "carbon source"/"etchant" gas combinations are used to grow carbon nanostructures (e.g. $C_2H_2/NH_3$, $C_2H_2/H_2$, $CH_4/H_2$). The main role of the etchant gas is to prevent formation of a carbon film directly from the gas (plasma) phase on the catalyst. Such unwanted deposition deactivates catalyst. An optimal gas ratio is usually found at which the carbon film is removed but the nanostructure grown catalytically is not damaged. In one embodiment, the present invention replaces the etching reaction with an exothermic catalytic oxidation reaction that heats the catalyst in an addition to cleaning its surface. For example, adding oxygen to a mixture of acetylene and ammonia is not deleterious to nanofiber morphologies and provides a catalytic reaction with higher yield than decomposition of acetylene.

Computational Modeling

The synthesis of CNTs on a substrate by selective heating of catalyst using an exothermic reaction was computationally simulated using a 1-D model of a DC glow discharge cell coupled to a surface kinetic reaction model. Gas-phase and surface reactions were simulated for a $C_2H_2/NH_3/O_2$ plasma system on a silicon substrate coated with the nickel (Ni) catalyst. Major surface exothermic reactions include surface heating by ion impact, thermal decomposition of hydrocarbons, catalytic oxidation, and $H_2O$ and $CO_2$ formation and adsorptions from the surface of catalyst. Endothermic processes included removal hydrogen and hydro-nitrogen species from the surface, and carbon incorporation into CNTs.

Figure 1:
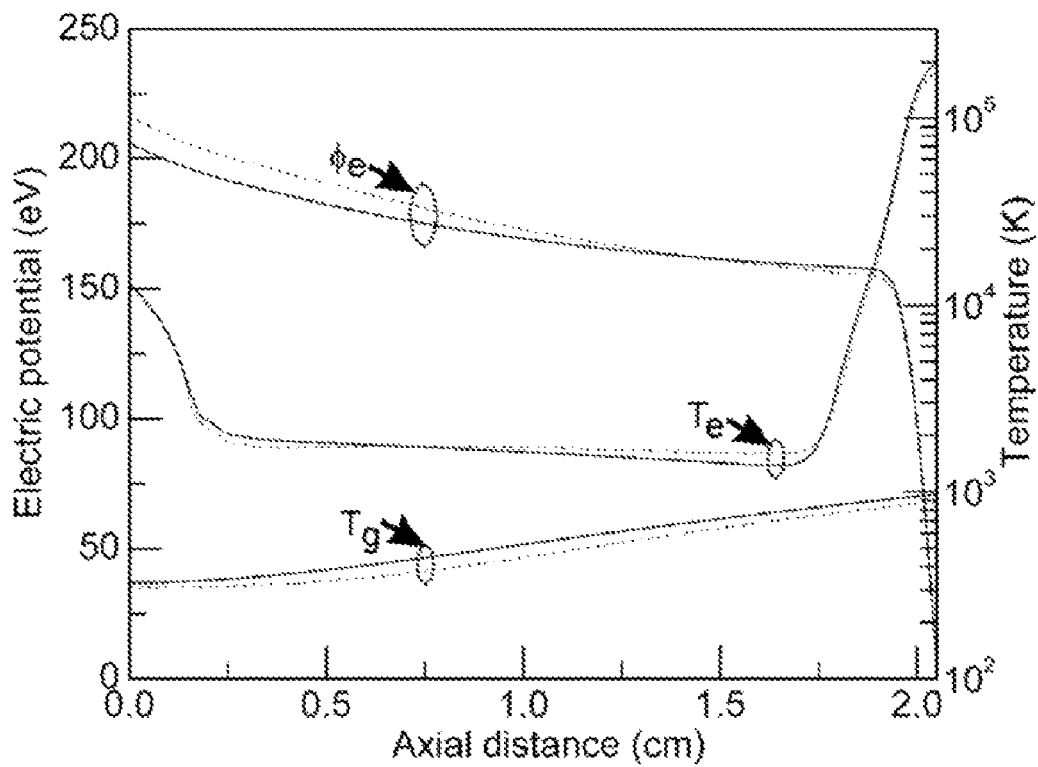
FIG. 1 is a graph showing the computationally simulated axial distribution of electric potential, and electron and gas temperature computed for a DC PECVD reactor used for CNT synthesis, as measured from the cathode toward the anode.

The discharge was sustained in a $C_2H_2/NH_3$ or a $C_2H_2/NH_3/O_2$ mixture between two electrodes separated by 2 cm, at pressure of 10 Torr, and a plasma current of 1 A. The axial distribution of electric potential, and electron and gas temperature is given in FIG. 1. Electrons originating from the cathode are accelerated by a large electric field and reach temperatures in excess of 10 eV. Comparative analysis of temperatures in $C_2H_2/NH_3$ and $C_2H_2/NH_3/O_2$ discharges shows that gas temperature close to the substrate in $C_2H_2/NH_3/O_2$ discharge is about 100 K larger than the corresponding temperatures in $C_2H_2/NH_3$ discharge. The electron temperature in $C_2H_2/NH_3/O_2$ discharge is also higher than that in $C_2H_2/NH_3$ discharge due to the high ionization threshold of $O_2$ molecules. The computed gas temperature near the substrate, shown in FIG. 1, exceeds the temperature of about 600 K observed experimentally, because heat removal from reactor walls is not accounted in simulations.

Figure 2:
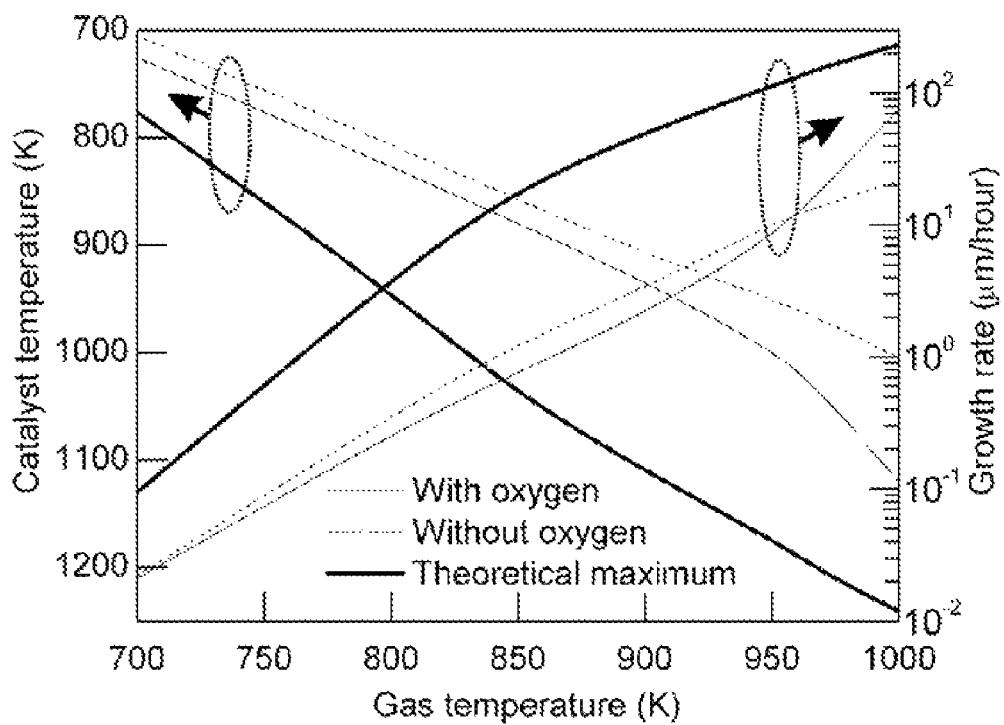
FIG. 2 is a graph showing the computationally simulated temperature of catalyst and growth rate of CNTs.
Figure 3:
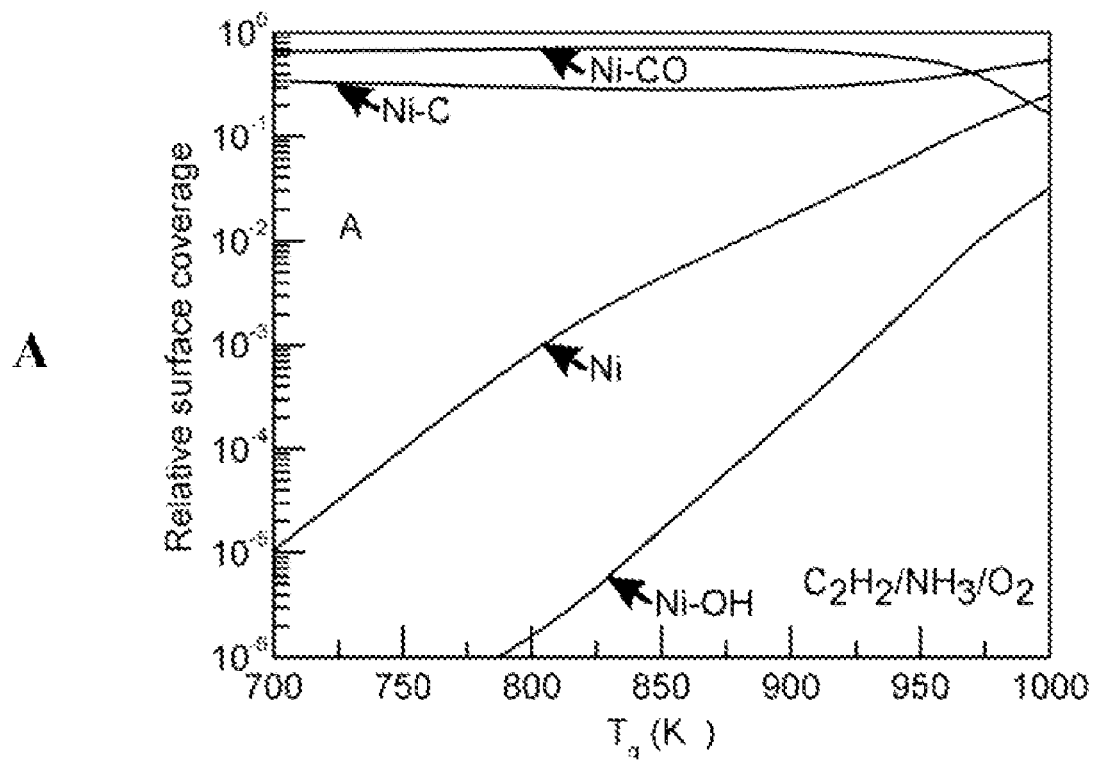
FIG. 3 is a graph showing the calculated relative fractions of major surface species obtained for $C_2H_2/NH_3/O_2$ discharge cell for the growth of CNTs.
Figure 3:
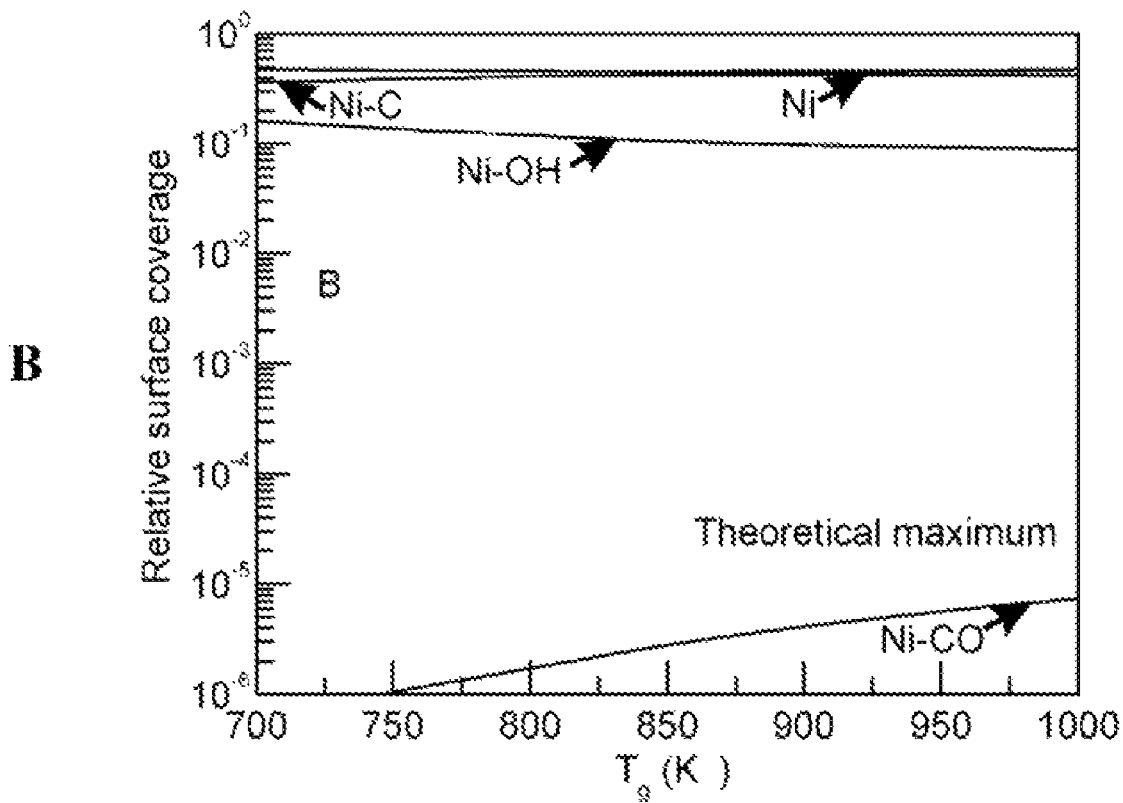

Comparative analysis of surface kinetics during nanostructure growth in $C_2H_2/NH_3$ and $C_2H_2/NH_3/O_2$ discharge ceils was performed using computational simulation (FIG. 2). The growth rate of CNF with oxygen is similar or even lower than that without oxygen for gas temperature below 950 K. However, for higher gas temperatures, the growth rates and catalyst temperatures obtained with oxygen increase with gas temperature faster than those without oxygen. The simulations for theoretical maximum predict an increase in both growth rate and catalyst temperature. For example, substantial growth rates of 18 μm/hour and catalyst temperature of 1036 K can be obtained for $T_g$=850 K when large O flux is applied towards the surface. The relative fractions of major surface species obtained for the $C_2H_2/NH_3/O_2$ discharge cell are given in FIG. 3A. One can observe the formation of large amount of CO on the surface of catalyst. The artificial increase in the oxygen flux towards the surface significantly changed the surface coverage as illustrated in FIG. 3B. Reaction with gaseous $O_2$ effectively removed CO from the surface of catalyst. Consequently, the concentrations of both empty Ni sites and Ni—C sites were large and effective growth of carbon nanostructures was observed even at low gas temperatures.

Example 1: Synthesis of CNTs/CNFs using catalyst selectively heated by an exothermic reaction experiments were conducted in a direct current (DC) PECVD system. Nickel catalyst films 100 Å thick were deposited on Si(100) substrate by electron beam evaporation or RF magnetron sputtering at a base pressure of $10^{-6}$ Torr. After catalyst deposition, the Si substrates were diced into chips and placed onto substrate in a PECVD system. After heating the samples to the desired growth temperature, the films were pretreated in $NH_3$ DC plasma for 2 minutes to facilitate nanoparticle formation from the solid thin film. After pretreatment, acetylene and oxygen gases, were introduced and the growth of carbon nanofibers was performed for 10 min.

Figure 4:
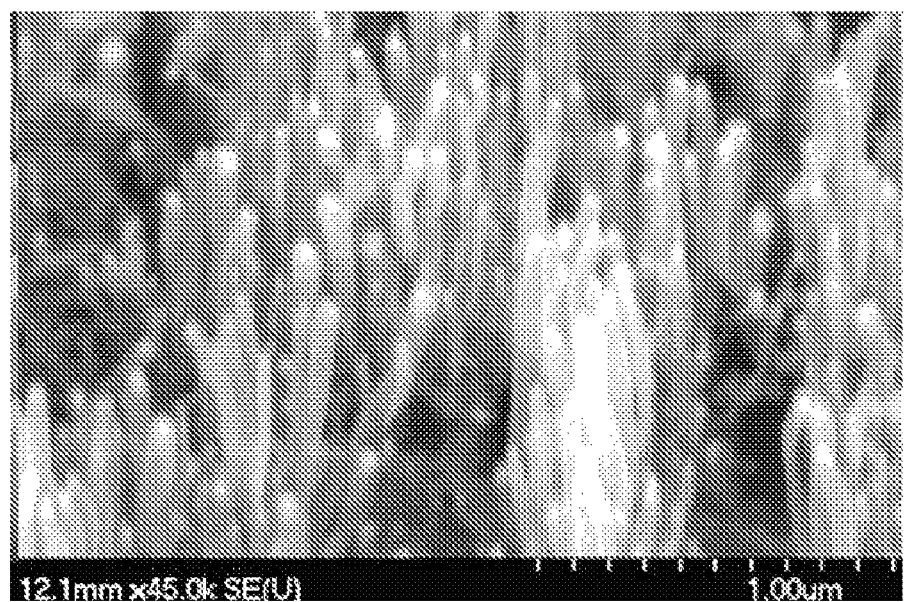
FIG. 4 is a SEM image of CNTs synthesized at a temperature of 220° C. for a $C_2H_2/NH_3/O_2$ gaseous feedstock, a gas pressure of 10 Torr, a gap voltage of 500V, and a plasma current of 1 A.

In order to obtain optimal growth conditions at lower temperature, experiments were performed starting at known optimized high temperature conditions for acetylene/ammonia gas mixtures, then gradually varied toward the lower temperature, plasma power, and increased percentage of oxygen. FIG. 4 shows nanofibers grown with oxygen at 220° C. from a $C_2H_2/NH_3/O_2$ gaseous feedstock, a gas pressure of 10 Torr, a gap voltage of 500V, and a plasma current of 1 A without substrate heating. Further decrease of the substrate temperature is possible by active cooling of the substrate to compensate for plasma heating.

Selective Heating of Catalysts Using RF Electro-Magnetic (EM) Energy

Inductive heating of metal samples using RF electromagnetic fields is used in biology and medicine (6). For example, macromolecules such as DNA can be heated to temperatures up to 70° C. using inductively heated metal particles of a few nm in size (7). These methods, however, are not sufficient or compatible with CNT growth, in part, because heating of catalyst for the efficient synthesis of CNTs requires temperatures an order of magnitude higher than those used in biomedical applications.

A computational study of inductive heating of Ni catalytic particles by RF electromagnetic fields was performed. The propagation of the fields produced by a RF antenna toward catalytic nanoparticles was modeled by solving the time-dependent equation for the vector magnetic potential A given by (8), $$\frac{1}{\mu_0 \mu_r} \nabla^2 \vec{A} = \varepsilon_0 \varepsilon_r \frac{\partial^2 \vec{A}}{\partial t^2} + \sigma \frac{\partial \vec{A}}{\partial t} + \vec{j}_{coil} \sin(2\pi \omega t), \quad (1)$$

where $\mu_0$ and $\mu_r$ are the vacuum and relative permeability, respectively; $\varepsilon_0$ and $\varepsilon_r$ are the vacuum and relative permittivity and $\sigma$ is the conductivity, $j_{coil}$ and $\omega$ are the current and frequency of rf antenna. Oscillating magnetic fields produced by the antenna resulted in oscillating electric fields interacting with the catalyst. Because of the skin-effect, the rf electric fields penetrate inside catalyst only within the skin depth and induced electric current, $J=\sigma E$, where electric field is $E=-\partial \vec{A}/\partial t$. Inductive heating of catalytic particle, $H_{ind}=J\cdot E$, can be thought of as joule heating with the conductive currents generated by the time varying field. The heat transfer equation accounting for inductive heating of catalyst can be written as $$c_p \rho_m \frac{\partial T}{\partial t} - \nabla(\kappa \nabla T) = H_{ind} \quad (2)$$

where $c_p$ is the specific heat, $\rho_m$ is the density of material, $\kappa$ is the thermal conductivity.

A 2-Dimensional computational investigation of inductive heating of catalytic particles of size varied from 100 nm to 10 μm was performed using CFD-ACE® multi-physics software. RF fields for inductive heating of catalyst were generated by a RF antenna located 2 cm from the catalytic particle surrounded by SiO₂ glass representing the temperature-sensitive surface of a substrate in a CCVD reactor. The current of the RF antenna $j_{coil}$ was increased with decreasing size of the particle to ensure that the catalyst temperature remained in excess of 1000 K.

Figure 5:
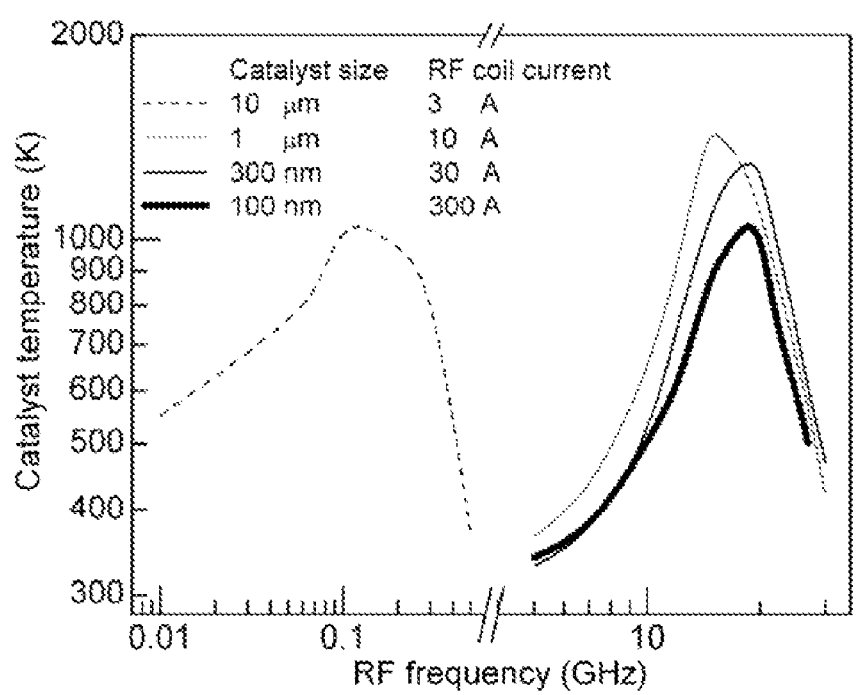
FIG. 5 is a graph showing the results for simulations of inductive catalytic particle heating using various frequencies of RF energy.

Temperatures of catalytic particles ranging in size from 10 μm to 100 nm obtained at various frequencies of a RF antenna are given in FIG. 5. The frequency required for efficient heating of catalyst increases as the size of particle decreases. For example, efficient inductive heating of catalyst particles 10 μm and 100 nm in diameter was achieved at frequencies of 100 MHz and 20 GHz, respectively. The current of the RF antenna must be substantially increased as the size of catalyst particles decreases in order to maintain heating of catalyst to temperatures in excess of 1000 K. For example, 10 μm catalyst was heated by a RF antenna operating at 3 A to a temperature of about 1000 K, while a RF antenna with 300 A current was required to achieve a similar temperature for a 100 nm catalytic particle. A pulsed RF antenna can be used to minimize heat transfer from catalyst particles to substrate.

Example

Selective Heating of Catalyst Using a RF Source

Figure 6:
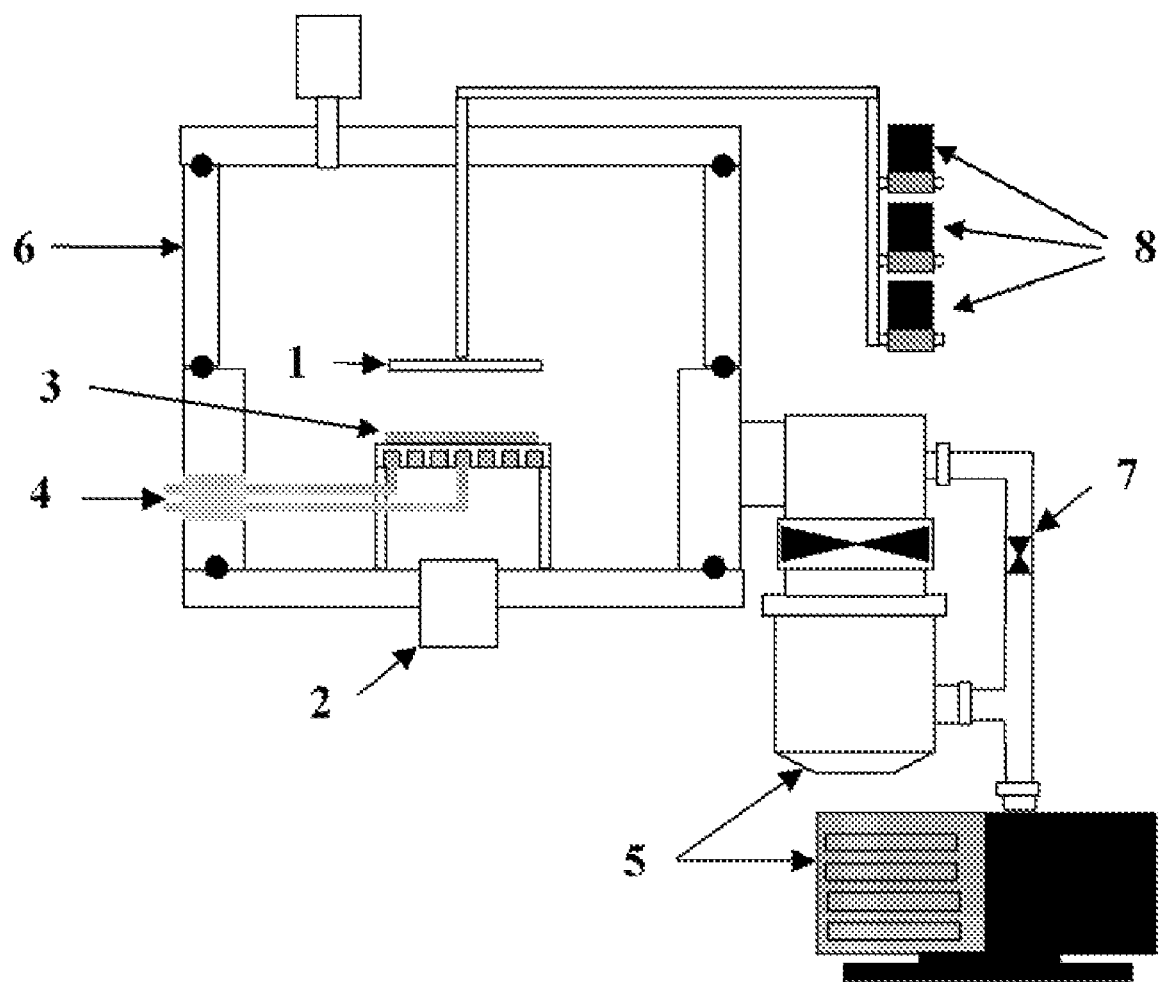
FIG. 6 is a schematic of a reactor for low-temperature synthesis of VACNTS/VACNFs.

Low-temperature growth of vertically aligned CNT (VACNT) may be performed in a mixture of acetylene and ammonia gas at several Ton: of total pressure flowing at around 60 and 80 sccm respectively, 700° C., and a bias of 500 V between substrate and a showerhead anode that maintains a current of 200 mA. An example of a system for low-temperature synthesis of CNT is shown in FIG. 6, The system comprises a 13.56 MHz RF source 1 for creating plasma discharge and an additional pulsed RF power source 2 with tunable frequency in the GHz range for inductively heating catalytic nanoparticles. A nonconducting substrate 3 is used to eliminate substrate Joule heating and a cooling system 4 is used for active cooling of the substrate. The system is initially evacuated to approximately $10^{-6}$ Torr using, for example, coupled turbo and mechanical pumps 5 so that the chamber 6 can be evacuated first mechanically and then using the turbo pump. To maintain stable plasma, an active pressure control device such as a mechanized throttle valve 7 is used. Mass flow controllers 8 regulate the flow of the carbon bearing feedstock gas, the promoter (ammonia) and oxygen.

REFERENCES

The following references cited in the specification are incorporated by reference in their entirety.
1. Ajayan, P. M. and O. Z. Zhou (2001). (Eds., M. S. Dresselhaus, G. Dresselhaus, Ph. Avouris, Springer-Verlag Berlin Heidelberg), *Topics of Applied Physics*: Carbon Nanotubes, 80; 391
2. Melechko, A. V., V. I. Merkulov, et al. (2005). *J. Applied Physics* 97(4): 041301-1
3. Hofmann, S., C. Ducati, et al. (2003). *Appl. Phys. Lett.* 83. 4661
4. Hofmann, S., C. Ducati, et al (2003). *Appl. Phys. Lett.* 83: 135
5. A. P. Graham, G. S. Duesberg, R Seidel, M. Liebau, E. Unger, F. Kreupl, and W. Honlein, Diamond and Related Materials 13: 1296 (2004)
6. S. Zinn and S. L. Semiatin, *Elements of Induction Heating, Design Control and Applications* (ASM International, Materials Park, Ohio, 1998)
7. K. Hamad-Schifferli, J. J. Schwartz, A. T. Santos, S. Zhang, and J. M. Jacobson, Nature 415, 152 (2002)
8. Balanis, C. A. *Advanced Engineering Electromagnetics* (John Wiley & Sons, New York, 1989)

A number of different specific embodiments of the invention have been referenced to describe various aspects of the present invention. It is not intended that such references be construed as limitations upon the scope of tills invention except as set forth in the following claims.

What is claimed is:
1. A method for synthesizing carbon nanotubes on a substrate comprising the steps of:
   a) providing a substrate, said substrate comprising nanoparticles distributed on the surface of said substrate,
   b) placing the substrate in a chemical vapor deposition chamber,
   c) simultaneously delivering gaseous hydrocarbon and oxygen to the nanoparticles using a catalytic chemical vapor deposition process, and d) selectively heating the nanoparticles to a higher temperature than the substrate by causing an exothermic oxidation reaction to occur on the surface of the nanoparticles such that the temperature on the surface of the nanoparticles is at least 500° C. to thereby synthesize carbon nanotubes or carbon nanofilaments wherein:

the nanoparticles distributed on said substrate consist of a material selected from the group consisting of Ni, Fe, Co, Cu, Al, V, Y, Mo, Pt, Pd and combinations thereof and the temperature of the substrate does not exceed 220° C.

2. The method of claim 1, wherein the substrate is a temperature-sensitive substrate.

3. The method of claim 1, wherein the carbon nanotubes are aligned.

4. The method of claim 1, wherein the catalytic chemical vapor deposition process is a plasma enhanced catalytic chemical vapor deposition process.

5. The method of claim 1, and further comprising the step of cooling the substrate.

* * * * *